United States Patent
Ohsawa et al.

[11] Patent Number: 5,809,225
[45] Date of Patent: Sep. 15, 1998

[54] SEMICONDUCTOR MEMORY WITH BUILT-IN PARALLEL BIT TEST MODE

[75] Inventors: Takashi Ohsawa, Yokohama, Japan; Shuso Fujii, Hopewell Junction, N.Y.

[73] Assignee: Kabushiki Kaisha Toshiba, Japan

[21] Appl. No.: 534,239

[22] Filed: Sep. 26, 1995

Related U.S. Application Data

[62] Division of Ser. No. 175,541, Dec. 30, 1993, abandoned.

[30] Foreign Application Priority Data

Mar. 12, 1993 [JP] Japan .................................... 5-051713

[51] Int. Cl.$^6$ .................................................. G06F 11/00
[52] U.S. Cl. ..................................................... 395/183.08
[58] Field of Search ........................ 395/183.08, 183.01; 365/189.04, 201; 324/73.1, 527; 371/21.2

[56] References Cited

U.S. PATENT DOCUMENTS

| | | | |
|---|---|---|---|
| 4,860,260 | 8/1989 | Saito et al. ............................... | 365/201 |
| 5,060,230 | 10/1991 | Arimoto et al. ......................... | 371/21.2 |
| 5,202,853 | 4/1993 | Choi ......................................... | 365/201 |
| 5,265,100 | 11/1993 | McClure et al. ......................... | 371/21.2 |
| 5,293,386 | 3/1994 | Muhmenthaler et al. ............. | 371/21.1 |
| 5,301,155 | 4/1994 | Wada et al. .............................. | 365/201 |
| 5,400,281 | 3/1995 | Morigami ................................ | 365/201 |
| 5,400,342 | 3/1995 | Matsumura et al. .................... | 371/21.2 |

*Primary Examiner*—Robert W. Beausoliel, Jr.
*Assistant Examiner*—Stephen C. Elmore
*Attorney, Agent, or Firm*—Banner & Witcoff, Ltd.

[57] ABSTRACT

A semiconductor memory includes a plurality of primary memory cells arranged in a row and column matrix formed on a semiconductor chip area and a plurality of redundant memory cells which replace primary memory cells which are found to be defective. The semiconductor memory includes a first test circuit for simultaneously writing one data value to a first number of the primary memory cells and simultaneously reading stored data from the first number of the primary memory cells to determine whether all of the stored data have the same data value, thereby performing a first parallel bit test on the first number of the primary memory cells. The first parallel bit test is performed while the semiconductor memory is in a wafer state. The semiconductor memory also includes a second test circuit which performs a second parallel bit test on a second number of primary memory cells. The second number is equal to the number of redundant memory cells in a redundant memory cell replacement unit (a row or column of redundant memory cells). The second parallel bit test determines whether the second number of primary memory cells should be replaced by a redundant memory cell replacement unit.

38 Claims, 12 Drawing Sheets

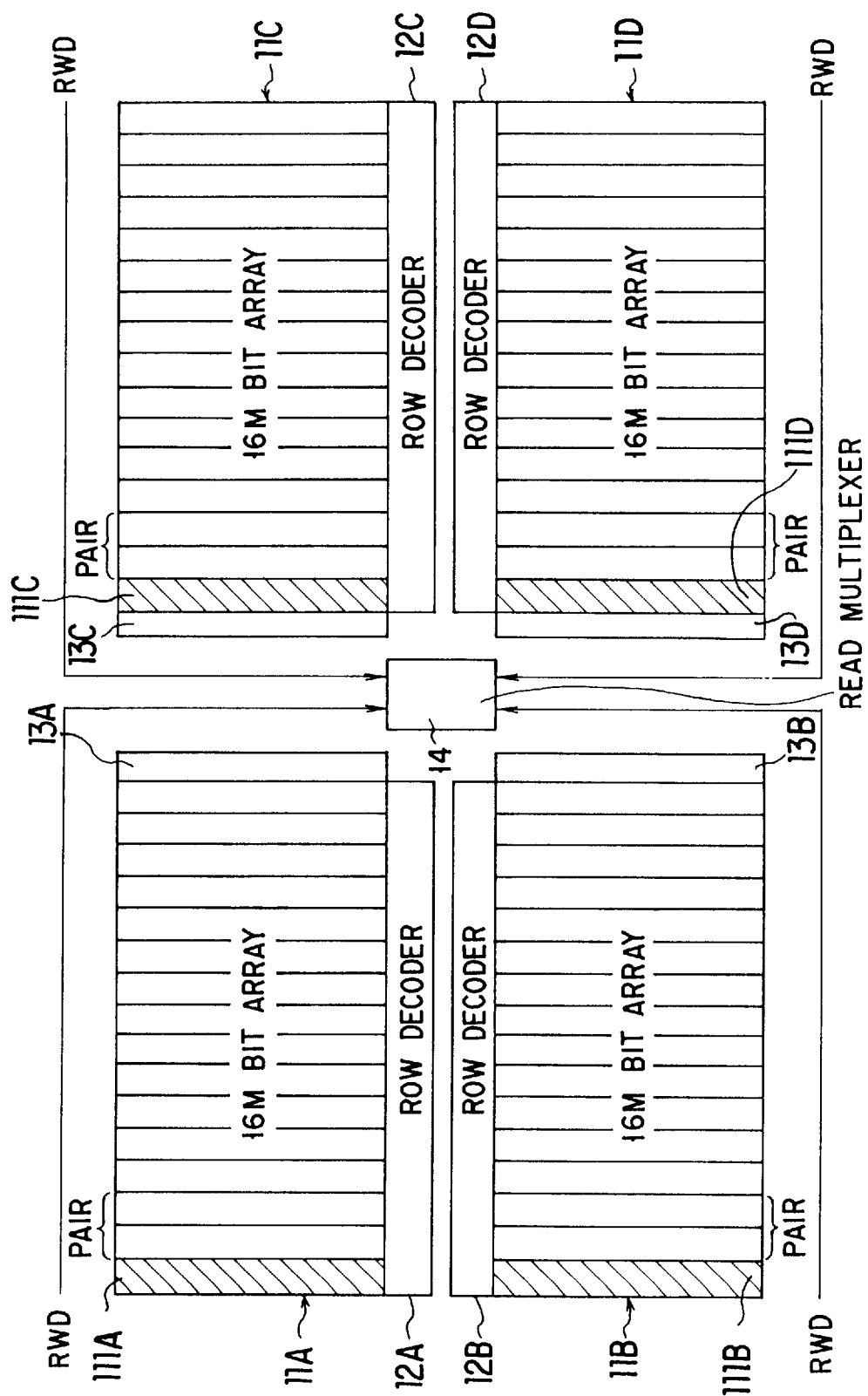
F I G. 2

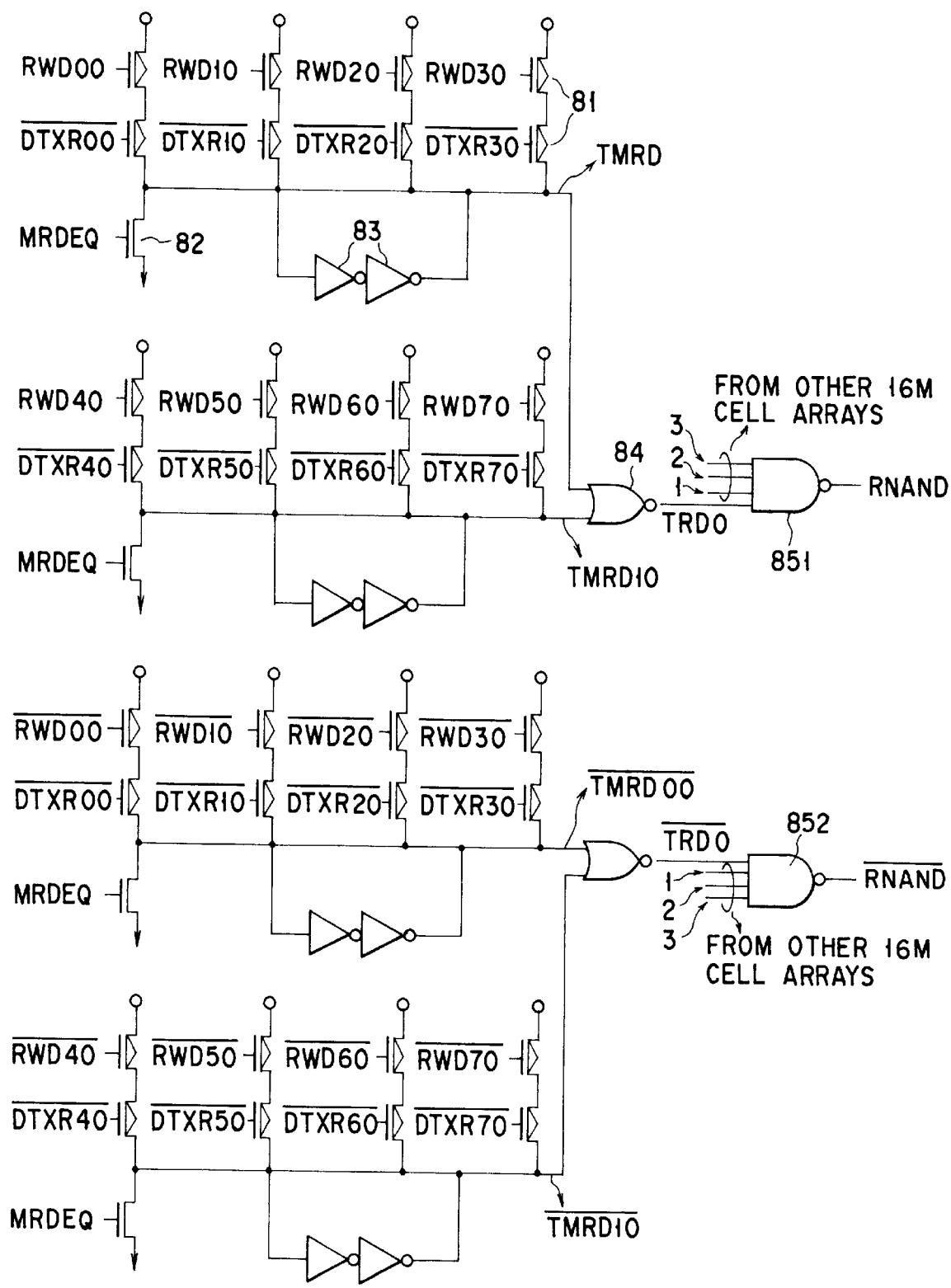
F I G. 9

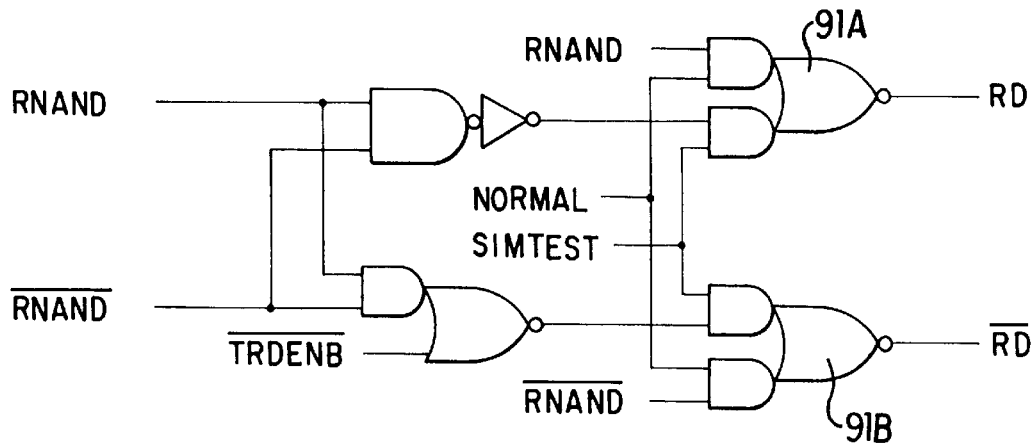
FIG. 10A
|  | NORMAL MODE | PACKAGE TEST | DIE SORT TEST |
|---|---|---|---|
| NORMAL | "H" | "L" | "L" |
| SIMTEST | "L" | "H" | "L" |
FIG. 10B
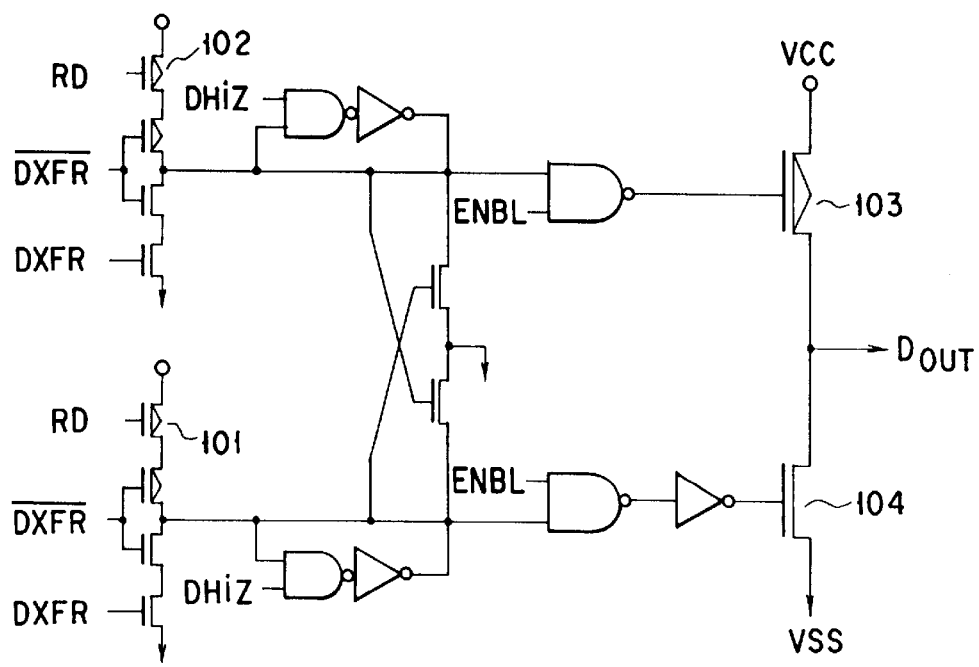
FIG. 11

SEMICONDUCTOR MEMORY WITH BUILT-IN PARALLEL BIT TEST MODE

This application is a division of application Ser. No. 08/175,541, filed Dec. 30, 1993, now abandoned.

BACKGROUND OF THE INVENTION

1. Field of the Invention

The present invention relates to a semiconductor memory and, more particularly, to a semiconductor memory with a built-in parallel bit test mode.

2. Description of the Related Art

Recent dynamic semiconductor memories (DRAMs) have a parallel bit test mode for performing a parallel test of a plurality of bits in order to shorten the test time.

This parallel bit test mode is to access a plurality of bits of a DRAM even with a x1 bit structure, instead of performing writing/reading one bit at a time to test the memory function bit by bit, or to access more bits than the number of inputs/outputs (I/O) for a DRAM with a multi-bit structure, thereby testing the functions of many bits simultaneously. That is, this test mode simultaneously writes the same data in n-bit memory cells, simultaneously reads the n-bit data in read mode to determine if each piece of data matches with each other, and outputs "1" or "0" in accordance with the matched/unmatched result.

This parallel bit test mode can reduce the number of cycles to access all the bits to 1/n (n: the number of bits) and can significantly shorten the test time.

An 8-bit parallel bit test mode that was standardized in JEDEC (Joint Electron Device Engineering Council) has been implemented in a 4M DRAM with a structure of 4M words×1 bit to which the parallel bit test mode was introduced first.

As the degree of the integration of DRAMs was increased, the number of bits to be simultaneously tested in parallel bit test mode was also increased to minimize an increase in test time. It is the current tendency of the individual makers to implement a 16-bit parallel mode in 16M DRAMs with a structure of 16M words×1 bit and implement a 32-bit parallel mode in 64M DRAMs.

In determining the test result of a DRAM having a structure of 64M words×1 bit, for example, 32-bit data is read simultaneously, the result is output to the output pad, and "1" is output if 32 bits are all "0" or "1" or "0" is output if 32 bits contain both "0" and "1".

This test method can ensure a 32-bit parallel test for checking if the writing/reading of cells can be performed correctly, thus greatly shortening the test time.

For devices with a multi-bit structure, which have an output pad as wide as the bit width, it is typical to employ a method for collectively outputting the results of the test for the entire to-be-tested bits to specific I/O terminals, as mentioned above, not outputting the results of the test on the properness/defectiveness of a subset of cells of a cell array to the individual I/O terminals.

For a test of a DRAM having a structure of 16M words×4 bits, for example, there is not yet an established method. It is however typical to use a method of writing the same data to 32 from a specific terminal (e.g., I/O0) in four I/O terminals and outputting the test results to that specific terminal, not outputting the results of reduction of 8 bits in four 16M cell arrays separately to the associated I/O terminals.

This system of outputting the test results for DRAMs with a multi-bit structure is used to test not only devices with a structure of n words×4 bits (n: an integer), but also to devices having a wider bit structure, such as n words×8 bits or n words×16 bits.

The following is the reason why the results of test on the properness/defectiveness of a subset of cells of a cell array are not output to the individual I/O terminals as mentioned above. Assuming that 32 bits are reduced in a DRAM with a structure of 4M words×16 bits and the result is output to the individual I/O terminals, the result of the reduction of only two bits is output to each I/O terminal and the probability of the aforementioned erroneous test results increases. For a DRAM having a structure of 16M words×4 bits, the aforementioned problem hardly occurs even with the use of the mentioned method that outputs the results of discrimination on the properness/defectiveness of a subset of cells of a cell array to the individual I/O terminals.

As described above, while the parallel bit test mode can significantly reduce the test time, the conventional parallel bit test mode, when adapted for use in DRAMs with a multi-bit structure, would raise the following problem.

FIG. 1 shows an example of the test procedures for DRAMs before delivery.

In general, a DRAM is provided with spare rows and/or columns. If there is a defective row or column, the defective row or column is replaced with the associated spare row or column to save the DRAM and prevent it from being rejected as a defective device.

In this case, a test is conducted on the device in a wafer state to determine if there are any defective memory cells after the wafer process is completed (the test in this stage is called "pre-die sort test"), and defective bits of the memory cells are memorized. The addresses of the finally established defective bits or the address of the finally established defective row or column is programmed in the associated spare row or column by the fuse blow or laser blow scheme, so that when the defective row or column is accessed, the associated spare row or column is actually accessed instead. Thereafter, a final-die sort test is performed to check if the defective row or column has been replaced accurately, and when the test result is satisfactory, this device will be sealed in a package.

The conventional parallel bit test mode cannot be used in the above pre-die sort for the following reason. For a DRAM having a structure of 16M words×4 bits, as the data of 32 bits is reduced and the result is output, it is not possible to determine which cell is in error, thus making it impossible to program the address of the defective row or column later.

In the conventional pre-die sort, therefore, the test should be conducted in the normal mode in which the memory cells are accessed bit by bit. This inevitably takes a significant time.

Of course, the redundancy system of saving the entire 32 bits to be simultaneously tested can obtain redundancy data even when the pre-die sort is executed in test mode.

With the conventional cell array structure, however, such a redundancy system of saving the entire 32 bits to be simultaneously tested is not generally employed, but a redundancy is generally provided independently for each 16M cell array instead. In the latter case, the bits are too reduced in the 32-bit parallel test and redundancy data cannot be obtained in test mode.

While FIG. 1 shows an example of performing the burn-in on a packaged device after assembling, the burnin may be carried out on a device in a wafer state.

According to the conventional semiconductor memories, as described above, the parallel bit test mode cannot be used to obtain redundancy data at the time of performing the pre-die sort. Instead, this redundancy data is obtained by conducting the test in normal mode, thus requiring a significant time for the pre-die sort.

SUMMARY OF THE INVENTION

It is therefore an object of the present invention to provide a semiconductor memory with built-in parallel bit test mode, which has a special test mode for pre-die sort that can output redundancy data and perform a parallel test on a plurality of bits for each cell array.

A semiconductor memory with a built-in parallel bit test mode comprises a memory circuit including memory cell arrays formed on a semiconductor chip area and laid out as a plurality of blocks, the memory circuit having a redundancy function for allowing each memory cell array to be saved independently by spare rows or spare columns; a first test circuit, provided in the memory circuit, for writing the same data to a plurality of bits of memory cells in the memory circuit and simultaneously reading the data from the plurality of bits to determine whether or not each piece of the simultaneously read data matches with each other to thereby perform a parallel test on a plurality of bits in a first parallel bit test mode specified when the semiconductor chip area is sealed in a package or is in a wafer state; and a second test circuit, provided in the memory circuit, for performing a parallel test on a plurality of bits of memory cells in the memory circuit wherein the number of bits tested simultaneously by the second test circuit is less than a reduced number of bits of data read in the first parallel bit test mode. The second parallel bit test mode is performed when the semiconductor chip area is in a wafer state. The number of bits tested in the second parallel bit test mode equals the number of bits included in a unit of redundancy replacement.

Suppose that the second parallel bit test mode (a special test mode for pre-die sort) is performed by supplying a signal to a pad on a wafer at the time the pre-die sort test is conducted. In this special test mode for pre-die sort, data reduction by the units of redundancy replacement as carried out in normal test mode is not performed, so that redundancy data can be obtained by outputting the result of error detection for each redundancy for each of a plurality of cell arrays of a semiconductor memory to an associated one of pads.

That is, the test can be performed on many bits by invoking the special test mode for pre-die sort in a wafer state, thus considerably shortening the time for the pre-die sort.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a diagram illustrating the cell array structure of a 64M DRAM having a structure of 64M words×1 bit, which is a semiconductor memory with a built-in parallel bit test mode according to one embodiment of the present invention;

FIG. 9 is a circuit diagram showing one example of a read multiplexer in FIG. 2;

FIGS. 10A and 10B are diagrams respectively showing an example of a circuit for outputting RD and /RD signals upon reception of RNAND and /RNAND signals in FIG. 9, and a truth table;

FIG. 11 is a circuit diagram showing one example of an output buffer circuit for outputting Dout upon reception of RD and /RD signals from the circuit in FIG. 10;

DETAILED DESCRIPTION OF THE PREFERRED EMBODIMENTS

One embodiment of the present invention will now be described in detail referring to the accompanying drawings.

A semiconductor memory with a built-in parallel bit test mode to which the present invention is applied, comprises memory cell arrays formed on a semiconductor chip area and each laid out as a plurality of blocks; a memory circuit having a redundancy function for allowing each memory cell array to be saved by spare rows or spare columns; a first test circuit provided in the memory circuit, and a second test circuit also provided in the memory circuit. The first test circuit writes the same data to a plurality of bits of memory cells in the memory circuit and simultaneously reads the data from the plurality of bits to determine whether or not each piece of the simultaneously read data matches with each other to thereby perform a parallel test on a plurality of bits in a first parallel bit test mode, which is specified when the semiconductor chip area is sealed in a package or is in a wafer state. The second test circuit performs a parallel test on a plurality of bits of memory cells in the memory circuit with a degree of reduction of bits, less than a reduced number of bits of data read in the first parallel bit test mode, in a second parallel bit test mode, which is specified when the semiconductor chip area is in a wafer state. Those bits reduced in the second parallel bit test mode are included in a unit of redundancy replacement.

The second parallel bit test mode is a special test mode for pre-die sort, which is performed at the time of conducting the pre-die sort test in a wafer state where the addresses of defective bits should be replaced with redundancy bits after discrimination.

Although this special test mode for pre-die sort can be incorporated in devices with a multi-bit structure, the following will discuss the case where this test mode is incorporated in a device having a 1-bit structure.

FIG. 2 illustrates the cell array structure of a 64M DRAM having a structure of 64M words×1 bit, which is a semiconductor memory with a built-in parallel bit test mode according to one embodiment of the present invention.

A 64M bit cell array (64M array) formed on the chip area is separated to four 16M bit arrays (16M array) 11A–D, each a row decoder 12 A–D arranged in association with one end side of each 16M array in the row direction (on the center side of the chip area) and a column decoder 13 A–D arranged at one end of each 16M array in the column direction (the center side of the chip area). Each 16M array 11A–D is separated to 16 1M cell array blocks (1M blocks) 111A–D. Eight pairs of data read/write lines (RWD lines) are formed in association with and in the vicinity of each 16M array 11A–D.

The reading system of the DRAM in FIG. 2 will be described in detail first.

Eight pairs of RWD lines corresponding to each 16M array 11 are connected to a read multiplexer 14.

Figure 3:
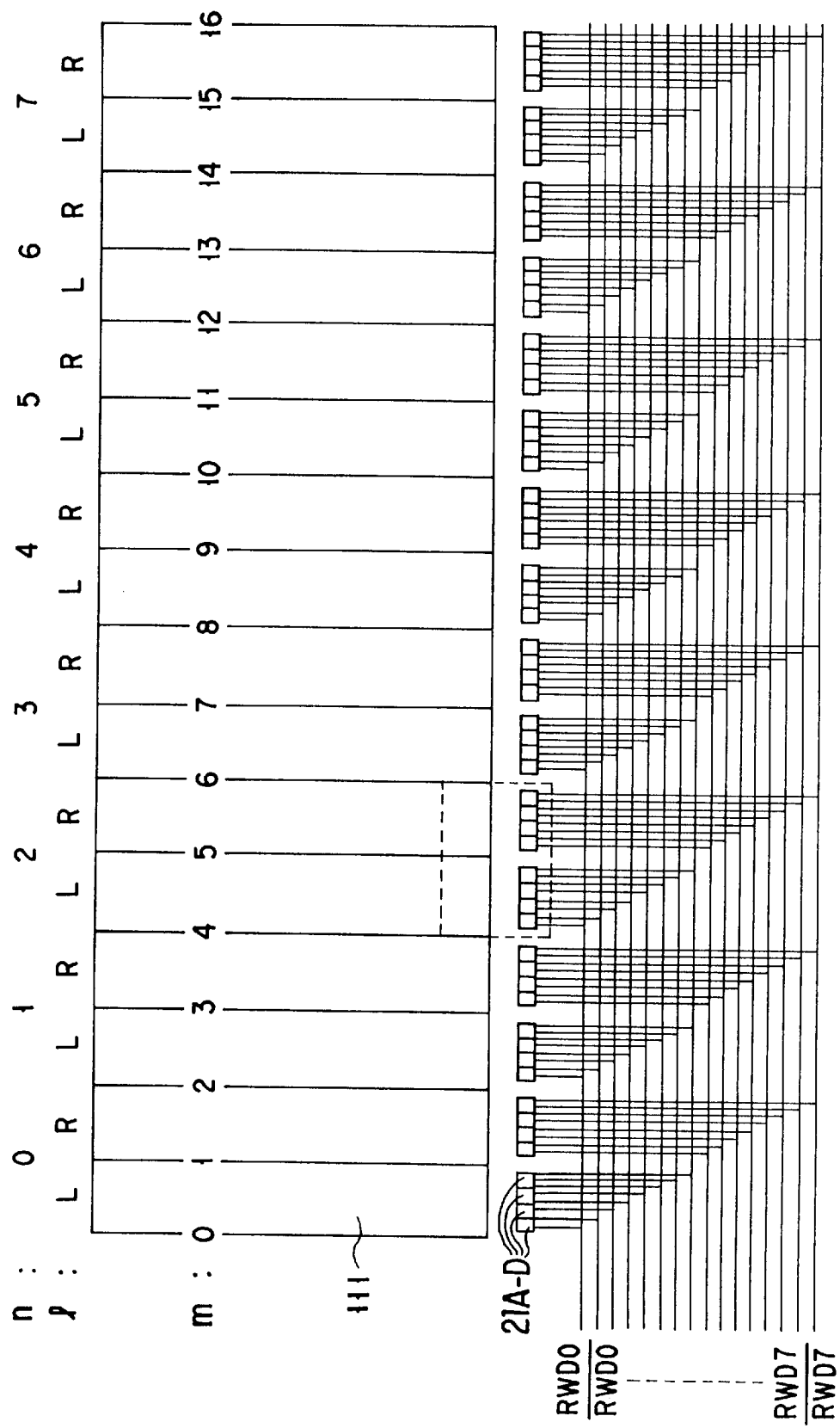
FIG. 3 is a detailed circuit diagram showing one of the 16M arrays in FIG. 2.

FIG. 3 presents detailed illustration of one of the 16M arrays in FIG. 2, and column select buffers (DQ buffers) and eight pairs of RWD lines associated with that 16M array.

Figure 4:
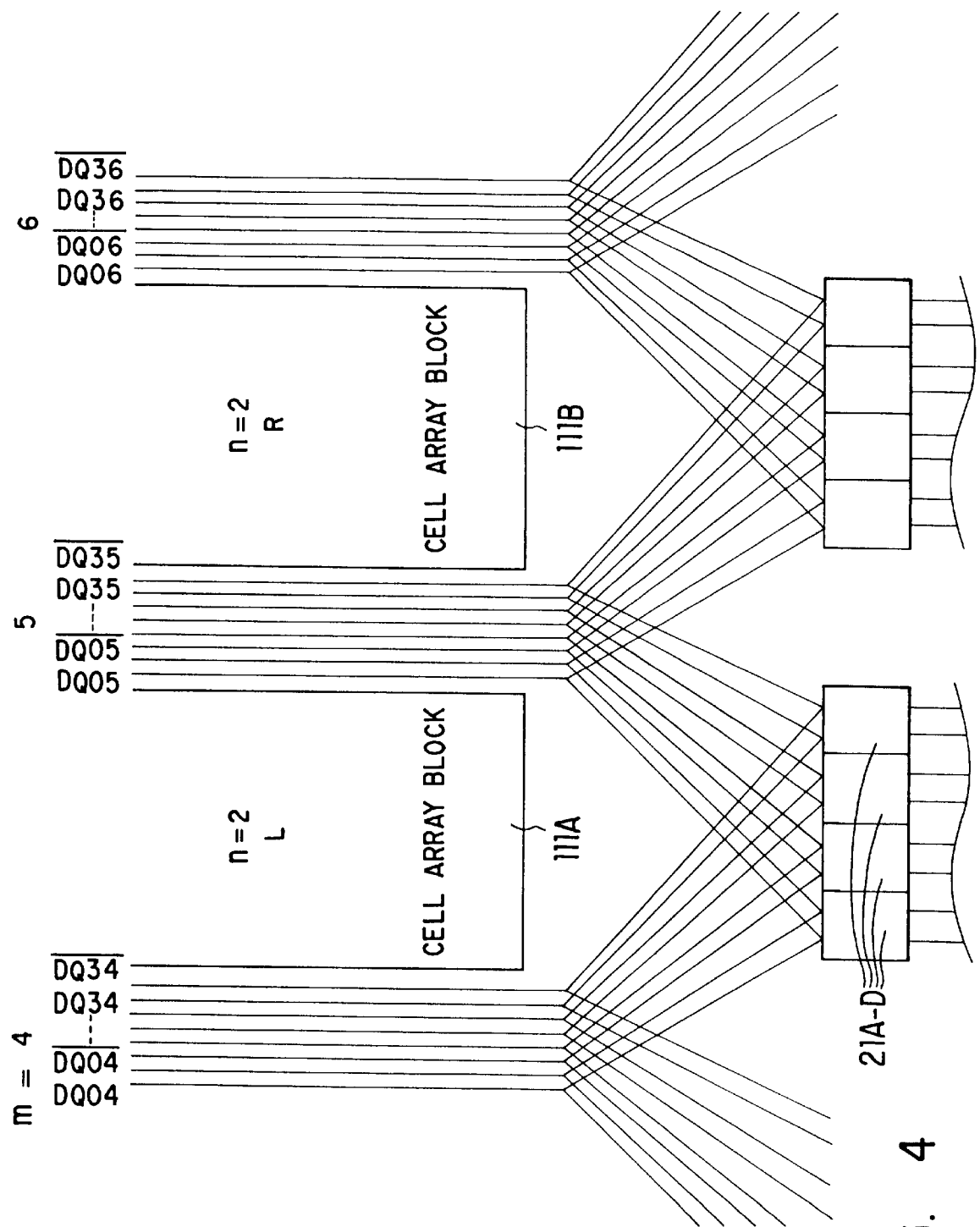
FIG. 4 is a detailed circuit diagram showing DQ buffers and DQ lines associated with one set of 1M blocks in FIG. 3.

FIG. 4 presents detailed illustration of the DQ buffers 21 and DQ lines associated with the portion indicated by the broken line in FIG. 3 (e.g., blocks L and R of n=2).

As shown in FIG. 3, there are eight sets of 1M blocks 111, each set consisting of two adjoining right and left blocks, in a 16M array. For the sake of convenience, the individual 1M blocks 111 are given set numbers n (0–7) and block numbers m (1–16), symbol L indicating the left block in each set and symbol R indicating the right block in each set.

As shown in FIG. 3, each block 111 is provided with four DQ buffer 21A–D and eight pairs of RWDi lines (i=0–7) are commonly provided in the vicinity of each block 111. As shown in FIG. 4, four pairs of data lines (DQ lines) run on both sides of the 16M array 11, i.e., outside the outermost block 111 (not shown) of each 16M array and between the individual blocks 111. As shown in FIG. 4, four pairs of DQ0i, /DQ0i lines to DQ3i, /DQ3i lines located on both sides of each block are connected to four DQ buffers 21 of the associated block as described later. /DQ0i denotes a complementary logic level of DQ0i, and /DQ3i denotes a complementary logic level of DQ3i. The same is applied to every signal described hereinafter. As shown in FIG. 3, four DQ buffers 21A–D corresponding to the block L in each block set are connected to four pairs of RWD0, /RWD0 lines to RWD3, /RWD3 lines and four DQ buffers 21 A–D corresponding to the block R in each block set are connected to the remaining four pairs of RWD4, /RWD4 lines to RWD7, /RWD7 lines.

When the block L of n=2 is enabled, data is read on a total of eight pairs of DQ lines on both sides of this block. Those pieces of data are input to the eight DQ buffers 21 corresponding to blocks L and R of n=2, are amplified there and are then selectively output to eight pairs of the RWD0 line to the RWD7 line. In this case, DQ04 to DQ34 lines and /DQ04 to /DQ34 lines are input to the four DQ buffers 21 corresponding to the block L of n=2 and DQ05 to DQ35 lines and /DQ05 to /DQ35 lines are input to the four DQ buffers 21 corresponding to the block R of n=2.

When the block R of n=2 is enabled, on the other hand, likewise, data is read on a total of eight pairs of DQ lines on both sides of this block. Those pieces of data are input to the eight DQ buffers 21 corresponding to blocks L and R of n=2, are amplified there and are then selectively output to eight pairs of the RWD0 line to the RWD7 line. In this case, DQ05 to DQ35 lines and /DQ05 to /DQ35 lines are input to the four DQ buffers 21 corresponding to the block L of n=2 while DQ06 to DQ36 lines and /DQ06 to /DQ36 lines are input to the four DQ buffers 21 corresponding to the block R of n=2.

As two adjoining blocks R and L in each block set are not simultaneously enabled, the same DQ buffers can be shared by the right and left blocks as mentioned above.

Although the above description has been given with reference to the case where the blocks with the set number n=2 are enabled, the same applies to the case where another set of blocks are enabled. That is, pieces of data, read on a total of eight pairs of DQ lines, four pairs on each side of the enabled block, are input to a total of eight DQ buffers 21, four corresponding to each block L or R of that set, and are amplified there.

Figure 5:
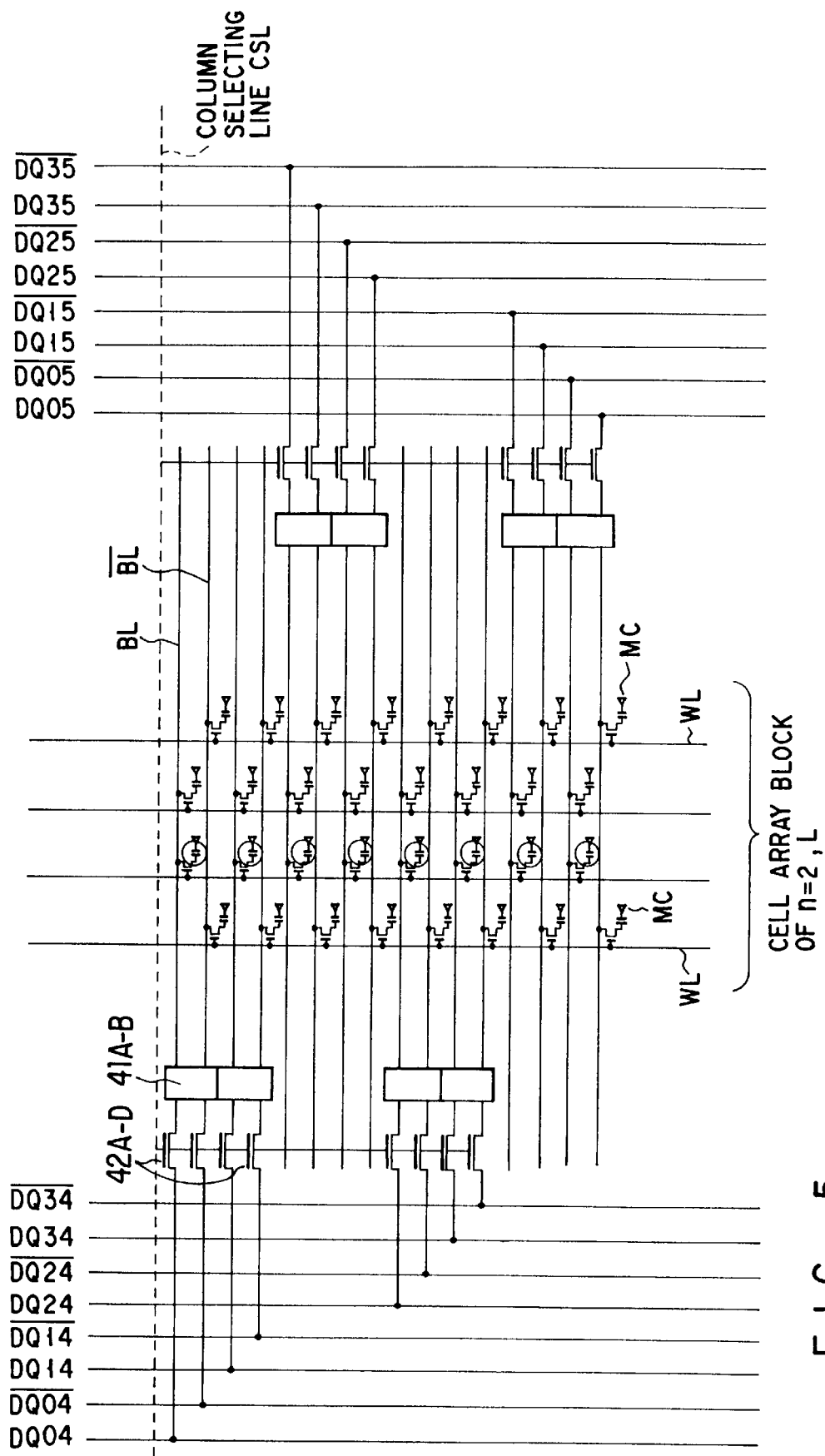
FIG. 5 is a circuit diagram showing in enlargement a part of a 1M block of 2 and L in FIG. 4.

FIG. 5 shows in enlargement a part of the block L of n=2 in FIG. 4.

In this diagram, BL and /BL indicate eight pairs bit lines (16 bit lines), WL indicates four word lines, and MC indicate individual memory cells for 32 bits. Each memory cell MC comprises one MOS transistor and one capacitor, and is provided in the vicinity of where the bit line BL or /BL crosses the word line W.

Connected to each bit line pair BL and /BL (called a "column") is a sense amplifier/bit-line precharger 41, which includes a signal amplifier and a circuit for fixing the bit line pair to a predetermined potential before amplification. The circuits 41A–B are alternately arranged on the left and right sides of the block for every two pairs of bit lines BL and /BL.

A total of eight pairs of DQ lines, formed four pairs on each side of the block, are connected to eight pairs of bit lines BL and /BL via NMOS transistors (column select gates and DQ gates) 42A–D to the gates of which column select lines CSL are input.

This structure allows data of the memory cell MC selected by the word line WL to be amplified by the associated sense amplifier 41A–B and allows the data selected by a single line CSL to be read on a total of eight pairs of DQ lines on the right and left sides of the block.

Although FIG. 5 shows the structure associated with a single line CSL, this structure is actually repeated so that data is coupled to eight pairs of DQ lines for every eight columns for each line CSL.

Figure 6:
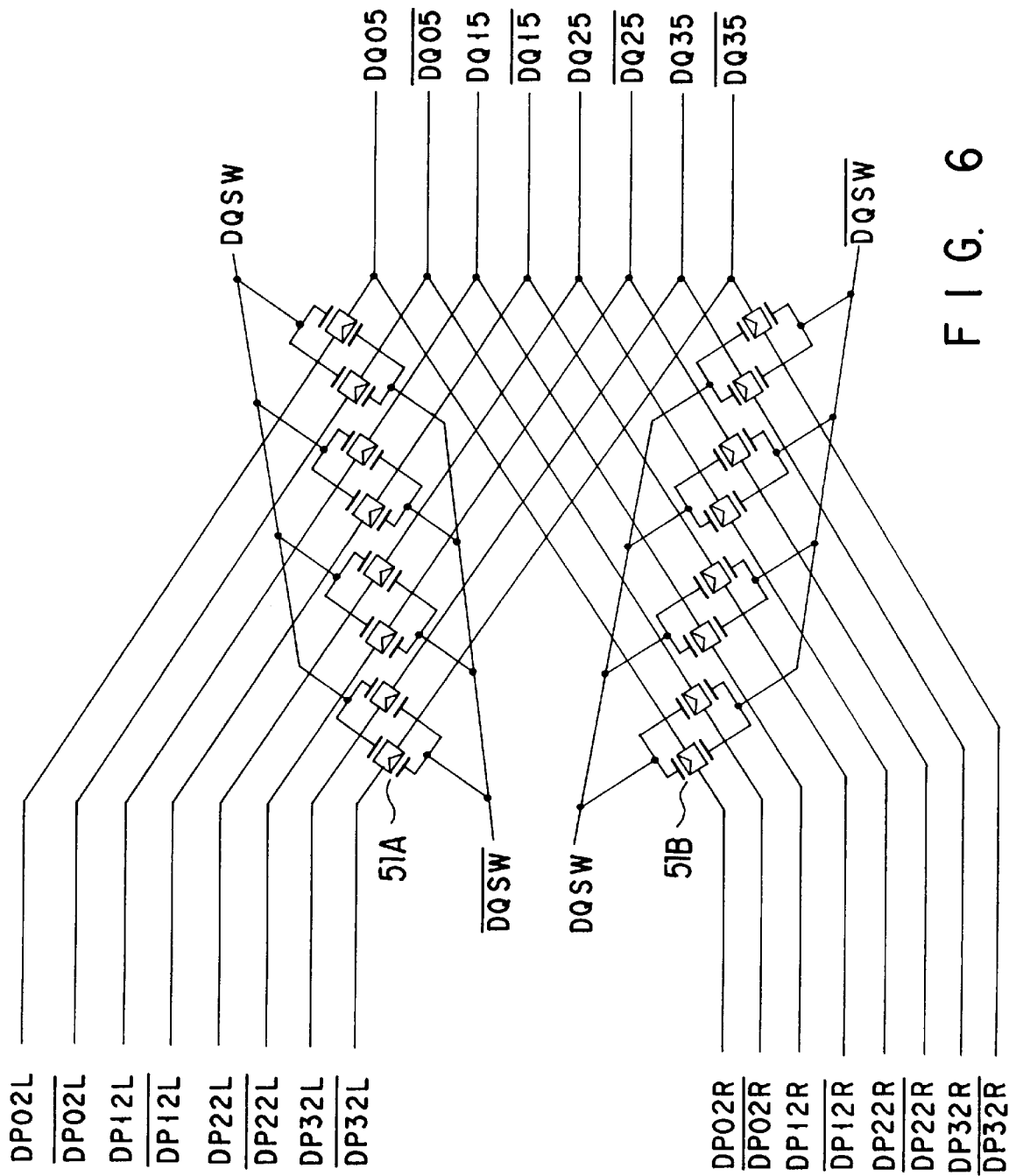
FIG. 6 is a circuit diagram showing one example of a switch circuit which allows data to be coupled to the DQ buffers shared by the right and left 1M blocks in FIG. 4.

FIG. 6 shows one example of a switch circuit which selectively couples one pair of DQ lines in FIG. 4 to those DQ buffers which are shared by the blocks L and R of n=2.

This switch circuit comprises a plurality of CMOS transfer gates 51A–B having their gates supplied with complementary signals DQSW and /DQSW.

In this diagram, DP02L, /DP02L to DP32L, /DP32L are DQ line pairs connected to the DQ buffers corresponding to the block L of n=2, and DP02R, /DP02R to DP32R, /DP32R are DQ line pairs connected to the DQ buffers corresponding to the block R of n=2.

Figure 7:
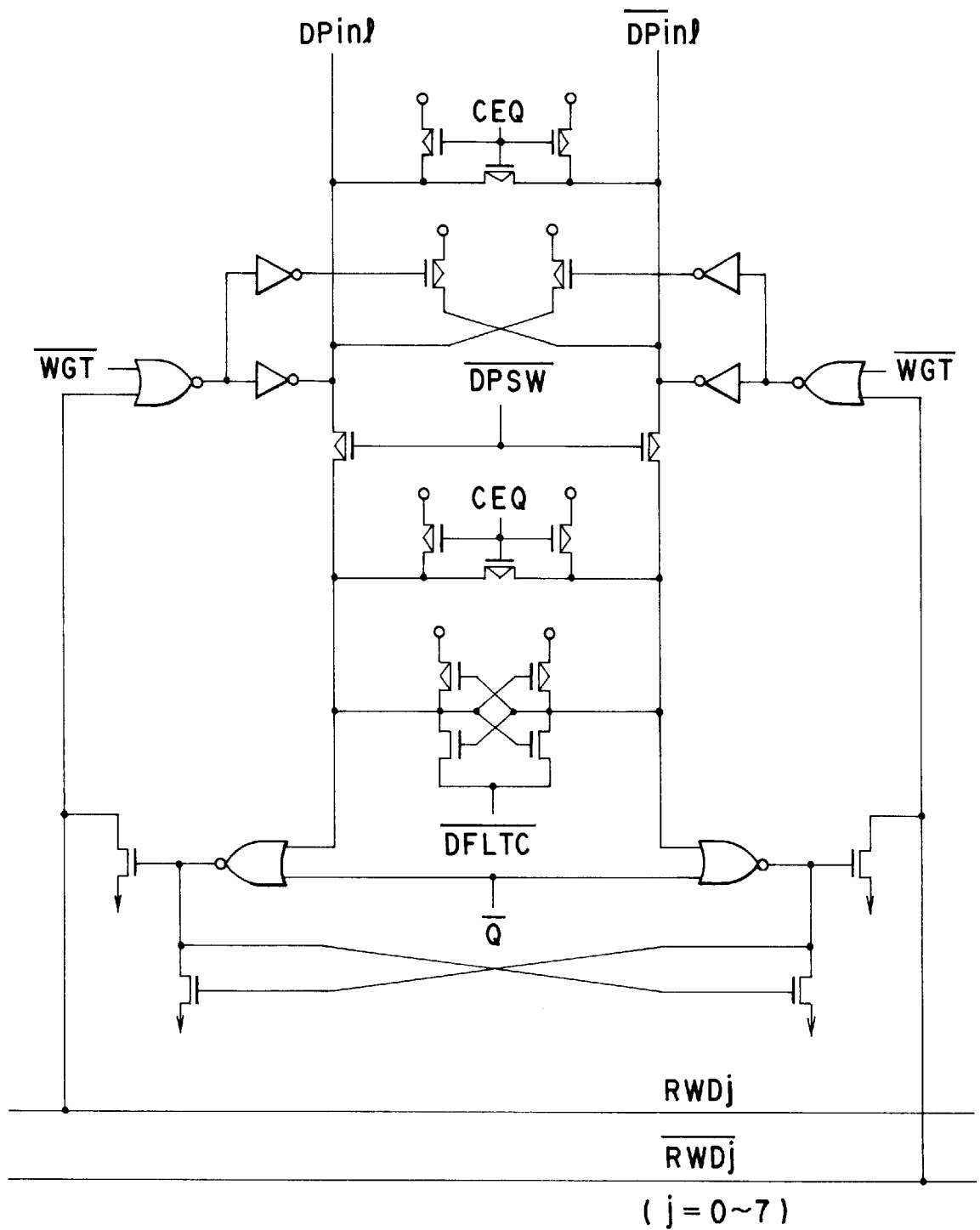
FIG. 7 is a diagram showing an example of the DQ buffer in FIG. 4.

FIG. 7 is a circuit diagram showing one example of the DQ buffer in FIG. 4.

In this diagram, DPinl and /DPinl (i=0–3, n=0–7 and l=L, R) are pairs of DQ lines connected to the associated DQ buffers (i=0–3, n=0–7 and l=L, R). As the structure of the DQ buffer itself is well known, its description will not be given below.

Figure 8:
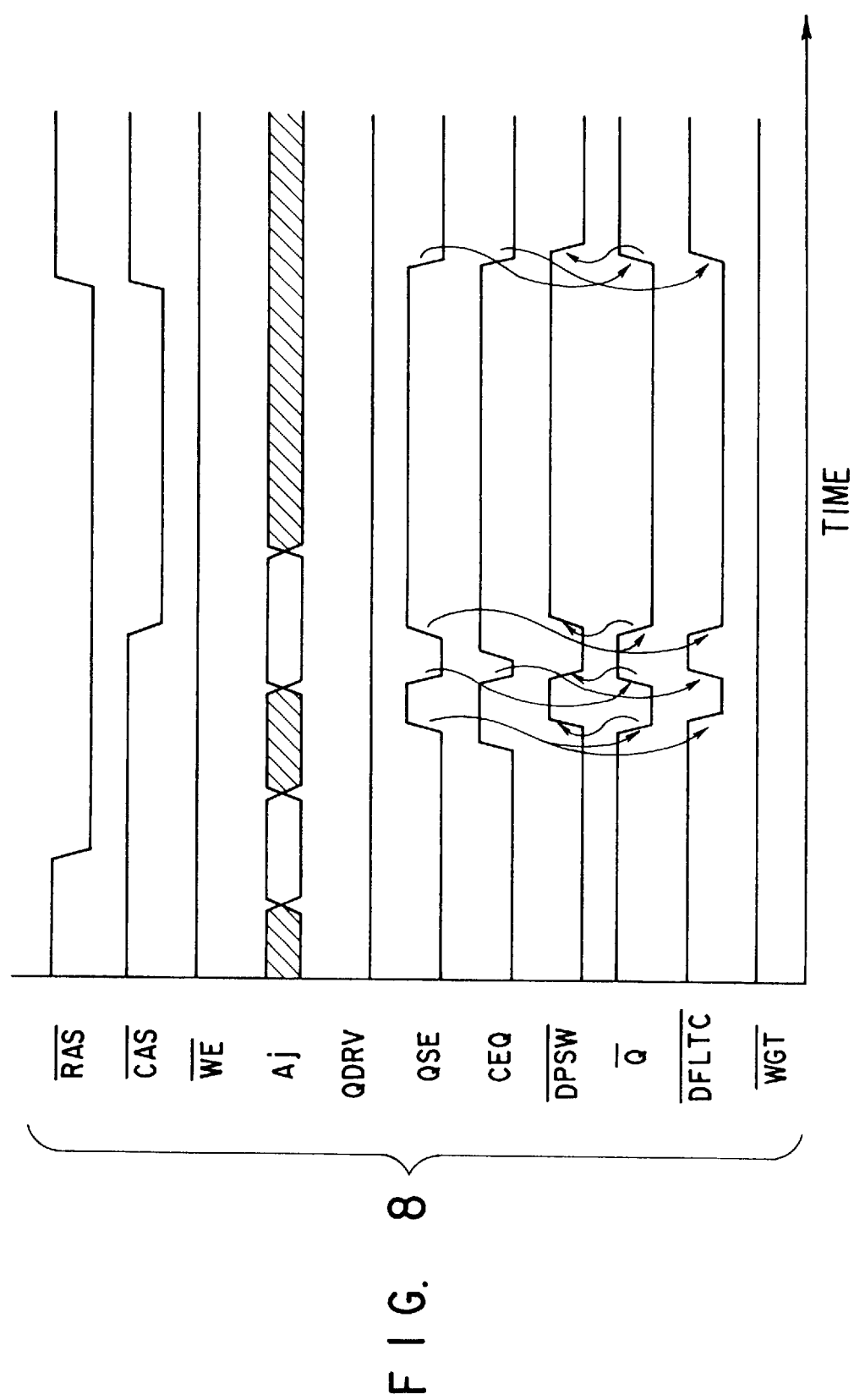
FIG. 8 is an operational waveform diagram exemplifying control signals for the DQ buffer in FIG. 7.

FIG. 8 is a timing chart showing an example of the operation of the DQ buffer in FIG. 7.

In this diagram, QDRV is a pulse signal which becomes "H" in write mode and QSE is a signal which enables the DQ buffers in read mode.

The operation of the DQ buffer itself is well known, it will be described briefly. The row address is obtained at the same time an /RAS (row address strobe) signal is enabled, and then the column address is obtained at the same time a /CAS (column address strobe) signal is enabled, thereby selecting CSL, and the associated data is latched at the enabling timing of a /DFLTC signal. Although, prior to the above operation, CSL corresponding to the column address equal to the row address is selected and the associated data is latched, this is abandoned by the latching of data read out by the enabled /CAS signal (necessary data).

The 64M DRAM shown in FIG. 2 is designed in such a way that in the 8K refresh cycle, only one of sixteen 1M blocks 111 is enabled for each 16M array during one cycle, and a total of four 1M blocks (for example, four hatched blocks in FIG. 2) are simultaneously enabled.

The same data can be written simultaneously in eight bits in the four blocks 111A–D or can be read simultaneously therefrom. Therefore, it is possible to simultaneously write the same data in cells with a total of 32 bits, and simultaneously read data from 32 bits.

FIG. 9 exemplifies a read multiplexer in FIG. 2.

In this diagram, "81" is a PMOS transistor, "82" is an NMOS transistor, "83" is an inverter, "84" is a 2-input NOR gate and "851" and "852" are 4-input NAND gates.

Two sets of circuits, each having sixteen PMOS transistors 81, two NMOS transistors 82, four inverters 83 and two 2-input NOR gates 84 connected as illustrated, are provided in association with a single 16M array. TRDj (j=0–3), the output signals from the first set of circuits in each of four 16M arrays, are input to the first 4-input NAND gates 851 and /TRDj, the output signals from the second set of circuits, are input to the second 4-input NAND gates 852.

In each set of circuits above, before data is read in, an MRDEQ signal becomes "H" temporarily to turn on the N channel transistor 82, setting TMRD0j, TMRD1j, /TMRD0j and /TMRD1j, which are input nodes of the 2-input NOR gate 84, to a low level.

A description will now be given of the read operation of the read multiplexer in FIG. 9 in normal mode and the reduction of a plurality of bits in parallel bit test mode.

At the time of the reading operation of a DRAM with an ordinary x1-bit structure in normal mode, after one block 111 in each of four 16M arrays 11 are enabled and 8-bit data is output on eight pairs of RWD lines, only one of /DTXR00–/DTXR70 signals (e.g., /DTXR00) which is selected by the address becomes a low level. Accordingly, 1-bit data on the RWD line (e.g., RWD00) is selectively sent to TMRD00, TMRD10 and /TMRD00, /TMRD10, and passes through the 2-input NOR gate 84 to become TRD0 and /TRD0 signals.

Likewise, data is output on the RWD lines for the other 16M arrays, but since TRDj and /TRDj from the other unselected 16M arrays have a high level, only the data from the selected 16M array passes through the 4-input NAND gates 851 and 852 to become RNAND and /RNAND signals.

At the time of the reading operation in parallel bit test mode, since /DTRX00 to /DTRX70 signals all become a low level, TRD0 or /TRD0 becomes a low level if there is any low-level signal among the RWD00 to /RWD70 data.

With no error, therefore, if all the RWD lines corresponding to four-16M arrays are at an "H" level, the RNAND signal becomes "L" and /RNAND signal becomes "H," and if all the RWD lines are at an "L" level, the RNAND signal becomes "H" and /RNAND signal becomes "L".

If there is an error even in one bit, on the other hand, there are L-level and H-level RWD lines, RNAND signal becomes "H" and /RNAND signal becomes "H".

FIGS. 10A and 10B respectively show an example of a circuit for outputting RD and /RD signals upon reception of RNAND and /RNAND signals in FIG. 9, and a truth table for mode indicating signals NORMAL and SIMTEST.

In FIG. 10A, the symbols of logic circuits are the same as or similar to those of the logic circuits shown in FIG. 9, and the description of each symbol will not be given. This also applies to the following description.

A /TRDENB signal is a sync signal which becomes "L" from "H" after the RNAND and /RNAND data are settled, and is generated by a timer in the chip area.

FIG. 11 shows one example of an output buffer circuit for outputting Dout upon reception of RD and /RD signals from the circuit in FIG. 10. In this diagram, ENBL is an output enable signal.

Figure 12:
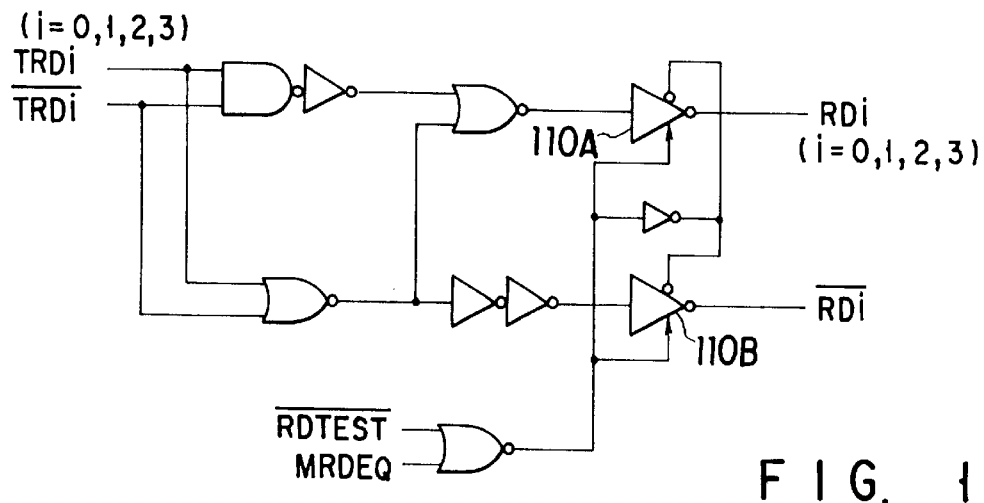
FIG. 12 is a circuit diagram showing one example of a circuit for outputting RDi and /RDi signals upon reception of TRDi and /TRDi signals from the read multiplexer in FIG. 9.

FIG. 12 shows one example of a circuit for outputting RDi and /RDi signals upon reception of TRDi and /TRDi signals from the read multiplexer in FIG. 9. In this diagram, "110" is a CMOS clocked inverter, and MRDEQ is a signal which temporarily becomes "H" before data is read as mentioned in the foregoing description given with reference to FIG. 9.

Although FIG. 12 shows only one set of a circuit which receives the i-th TRD and /TRD signals, there are actually four sets of circuits which receive TRDi and /TRDi signals (i=0, 1, 2, 3) in association with four 16M arrays and the RDi and /RDi signals will be output from the four sets of circuits.

Figure 13:
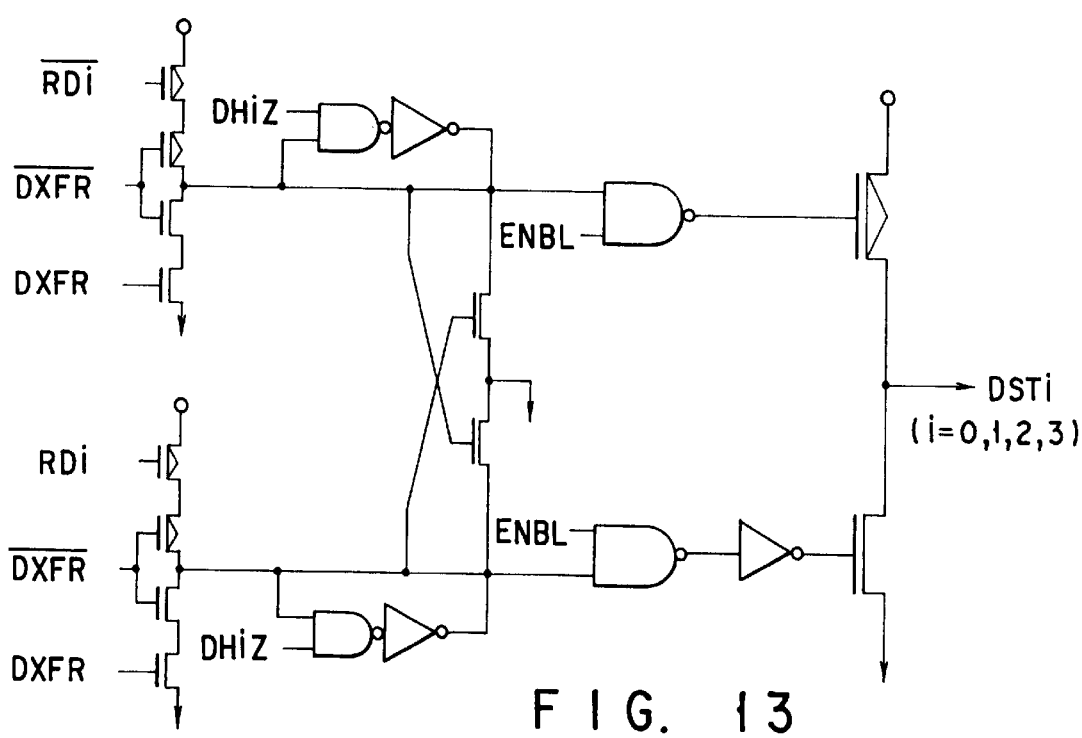
FIG. 13 is a circuit diagram showing one example of an output buffer circuit for outputting a DSTi signal upon reception of RDi and /RDi signals from the circuit in FIG. 12.

FIG. 13 shows one example of an output buffer circuit for outputting a DSTi signal upon reception of RDi and /RDi signals from the circuit in FIG. 12. Although FIG. 13 shows one set of an output buffer circuit, there are actually four sets of output buffer circuits provided for four 16M arrays.

The operations of the circuits in FIGS. 10 through 13 will be described below.

In normal mode, NORMAL and SIMTEST in FIG. 10 are respectively "H" and "L," and the RNAND and /RNAND signals are inverted by the NOR gates 91A–B and are as RD and /RD signals, which are then input to the output buffer circuit.

In this case, with the selected RWD and /RWD lines respectively being "H" and "L," RNAND="L" and /RNAND="H" so that RD="H" and /RD="L" and Dout becomes "1".

If the selected RWD and /RWD lines are respectively "H" and "L," Dout becomes "0".

Figure 1:
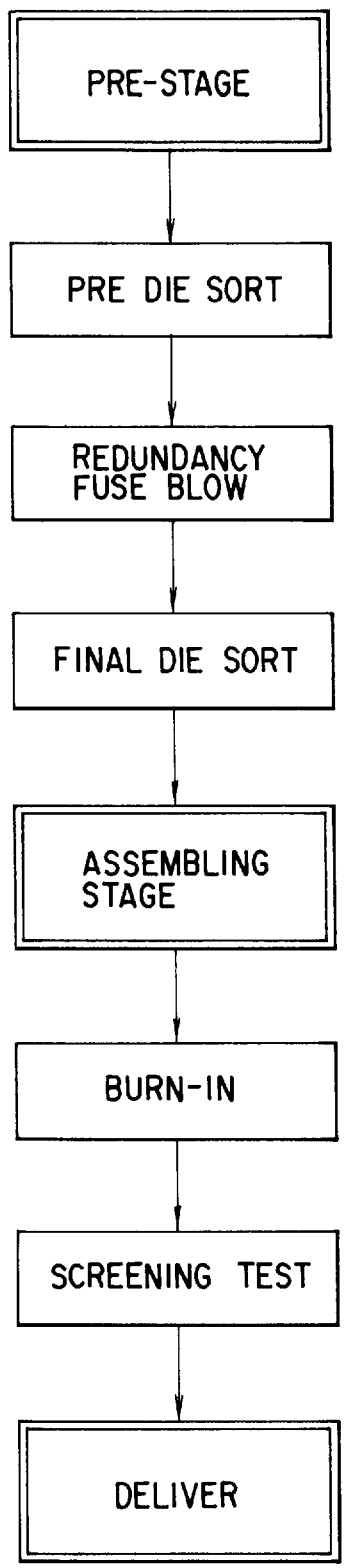
FIG. 1 is a flowchart exemplifying conventional test procedures for DRAMs before delivery.

In a package test (which is executed after the device is sealed in a package and to which the selection test shown in FIG. 1 is also equivalent), on the other hand, NORMAL= "L" and SIMTEST="H".

In this case, with no error, RNAND and /RNAND becomes complementary signals, RD="H" and /RD="L" and Dout becomes "1". That is, when 32 RWD lines are all "H" and 32 /RWD lines are all "L," RNAND="L" and /RNAND="H" and RD="H" and /RD="L". Likewise, when 32 RWD lines are all "L" and 32 /RWD lines are all "H," RNAND="H" and /RNAND="L" and RD="H" and /RD= "L".

If there is at least one error (if L-level and H-level lines are mixed in the 32 RWD lines and /RWD lines), on the other hand, RNAND="H" and /RNAND="H", RD="L" and /RD="H" and Dout becomes "0". If the same written pieces of data (8×4=32 bits in this example) are all in error and all the pieces of data are inverted, Dout becomes "1" although it is actually an error. In this case, it is erroneously judged that there is no error, but the probability of the occurrence of this event is too small to raise any practical problem.

Through the above-described operations, when the same pieces of data are written, it is possible to determined if they are aligned, and with no error, Dout becomes "1" and with at least one error, Dout becomes "0".

In the die sort test that is performed in a wafer state, since NORMAL="L" and SIMTEST="L," RD is "H" and /RD is "H" so that the PMOS transistors 101 and 102 in FIG. 11 whose gates are supplied with those RD and /RD signals, are turned off. The PMOS transistor 102 and NMOS transistor 104 in the final-stage output driver of the output buffer circuit in FIG. 11 are both turned off, setting Dout in a high impedance state (HiZ).

At this time, each pair of four pairs of TRDi and /TRDi signals (i=0, 1, 2, 3) which correspond to four 16M arrays are respectively input to the circuit in FIG. 12 of the associated 16M array. The discrimination of the matching/non-matching on each result of reading eight bits for each 16M array is performed separately and the RDi and /RDi signals are output for each 16M array.

The RDi and /RDi signals are input to the output buffer circuit (there are actually four sets of the output buffer circuits) in FIG. 13 of the associated 16M array, and finally, DSTi signals (i=0, 1, 2, 3) are output to four pads as the test results for each 16M array.

Figure 14:
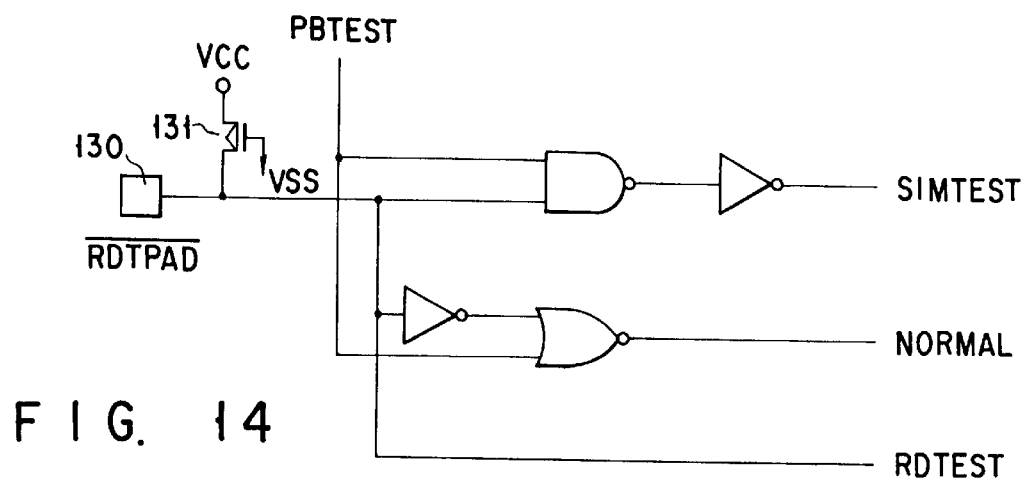
FIG. 14 is a circuit diagram exemplifying a generator for generating SIMTEST, NORMAL and /RDTEST signals in FIGS. 10 and 11.

FIG. 14 shows an example of a generator for generating SIMTEST, NORMAL and /RDTEST signals in FIGS. 10 and 12.

At the time of conducting the pre-die sort in a wafer state, the ground potential VSS is applied with the testing probe contacting a pad 130. This pad 130 is pulled up to the source potential VCC by a normally-ON PMOS transistor 131 which has small driving power, /RDTEST becomes a low potential (VSS) if the pad 130 is externally forced to be grounded. At the same time, SIMTEST and NORMAL are both dropped to a low potential. Accordingly, the aforementioned die sort test mode is invoked.

At the time of sealing the device in a package, /RDTEST is kept at the pulled-up high level by setting the pad 130 to a floating state, not bonding it, so that the die sort test mode will not be invoked.

If the package test mode is invoked by a separate circuit (not shown), however, the PBTEST signal becomes a high level, SIMTEST a high level and NORMAL a low level, so that the conventional 32-bit parallel bit test mode is established. Of course, if the PBTEST is at a low level, the mode remains to the normal access mode.

Figure 15:
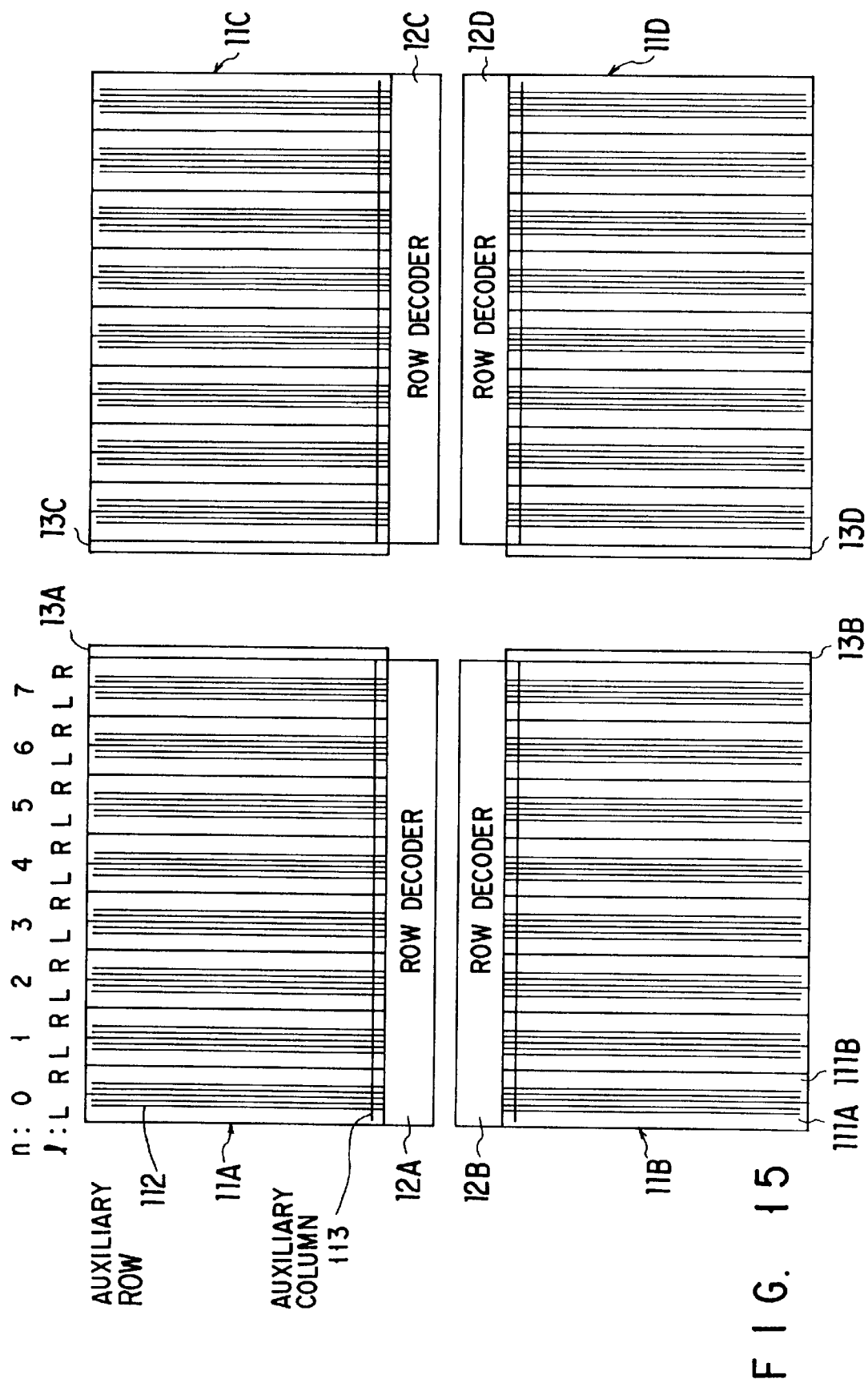
FIG. 15 is a diagram showing one example of the redundancy structure for a DRAM having a structure of 64M words×1 bit according to this embodiment.

FIG. 15 shows one example of the redundancy structure for a DRAM having a structure of 64M words×1 bit shown in FIG. 2. In FIG. 15, four 16M arrays 11A–D are designed to be independently saved by spare rows 112 and/or spare column 113.

That is, in each 16M array 11A–D, two spare rows 112 are arranged for each of the left and right blocks 111A–B with n=0–7, and one spare column 113 for each 16M array 11.

There are two spare rows 112 for each block (that are associated with those cells which are connected to the BLi side of the complementary bit line pair BLi and /BLi in a cell array and those cells which are connected to the /BLi side). A total of four spare rows 112 for the left and right blocks belonging to the same block number n are not actually independent, and are so designed that if there is one defective row in this block, it will be replaced with the four spare rows.

This unit of replacement is not limited to this particular type, and the present invention will not be affected at all by another available system.

Although the spare column 113 is commonly arranged for sixteen blocks 111A–D belonging to the same 16M array, it is designed in such a way as to spare a defective column independently for each block. This system is described in detail in Jpn. Pat. Appln. KOKAI Publication No. hei 4-64979 filed by the present applicant, so that the detailed description will not be given here.

This unit of replacement is not limited to this particular type, and the present invention will not be affected at all by another available system.

In the case where the test results for the entire 64M DRAM with the above structure are reduced and output in the pre-die sort test, defect data for each 16M array will not be obtained, making it impossible to replace a defective cell with a redundancy cell. If the test results are reduced for each 16M array and defect data is output for each 16M array, a defective cell can accurately be replaced with a redundancy cell by the fuse blow process, based on that data, as disclosed in the foregoing description of the present invention.

Assuming that cells of eight bits circled in FIG. 5 are to be simultaneously tested in the pre-die sort test, replacing data for the spare rows (data for replacing the entire single word line) and replacing data for the spare column (data for replacing a single column select line) can be obtained correctly.

Of course, in the case where there is one spare column for the entire 64M bits, redundancy data can be obtained even in 32-bit reducing test mode. But this system is not preferable because it will significantly reduce the redundancy's saving efficiency.

While the conventional pre-die sort for DRAMs obtains redundancy data by performing the normal access bit by bit, the pre-die sort for DRAMs to which this invention is applied can shorten the test time to ⅛.

As described above, according to the DRAM of this embodiment, the test, when being conducted after the device is sealed in a package, will reduce many bits over the entire chip area and will significantly shorten the test time, and the pre-die sort test in a wafer state will reduce read data in the units of redundancy replacement to obtain redundancy data faster than the prior art, although the test time will not be shortened as done by the test after the device is sealed in a package.

As described above, a special test mode for pre-die sort, which is capable of outputting redundancy data and performing a parallel test on a plurality of bits for each cell array, can be incorporated in the semiconductor memory according to this embodiment.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory with a built-in parallel bit test mode, comprising:

memory cells arranged in m memory cell arrays each comprising memory cell blocks, said memory cells including redundant memory cells arranged in redundant memory cell groups each for use in replacing defective memory cells;

n pairs of data read/write lines, provided in common to said memory cell blocks of each of said memory cell arrays;

m multiplexers provided in correspondence to said m memory cell arrays, each for multiplexing data read out of a selected one of memory cell blocks of the corresponding memory cell array;

a first logic circuit for receiving outputs of said multiplexers to perform a logic operation thereon;

a first test circuit provided in common to said m memory cell arrays, for performing a first parallel bit test on data read out of a first number of selected memory cell blocks of said m memory cell arrays, using an output of said first logic circuit;

m second test circuits provided in correspondence to said m memory cell arrays, each second test circuit performing a second parallel bit test on data read out of a second number of selected memory cell blocks of the corresponding memory cell array, using an output of said m multiplexers, first output means for outputting a test result of the first parallel bit test;

second output means for outputting a test result of the second parallel bit test; and mode switching means for switching between a first mode in which said first output means is enabled and a second mode in which said second output means is enabled.

2. A semiconductor memory according to claim 1, further comprising a control signal generator for generating a first-test control signal to enable said first test circuit and a second-test control signal to enable said second test circuits.

3. A semiconductor memory according to claim 2, wherein said control signal generator comprises a NAND gate for receiving a probe test signal and a data test signal and an inverter for inverting an output of said NAND gate to output a signal which is the first-test control signal to enable said first-test performing test circuit, the data test signal being a signal which is the second-test control signal to enable said second-test performing test circuit.

4. A semiconductor memory according to claim 3, wherein said control signal generator further comprises an inverter for receiving said data test signal, and a NOR gate for receiving said probe test signal and an output of the inverter to output a signal.

5. A semiconductor memory according to claim 1, wherein each of said multiplexers comprises a pair of transistor circuits, each of the paired transistor circuits comprises n series-circuits of transistors each connected between a power supply and a circuit node, each of the series-circuits includes two transistors connected in series to each other, a gate of one of the two transistors is supplied with a data read/write signal, and a gate of the other of the two transistors is supplied with a test control signal which renders said other transistor turned on when the first or second parallel bit test is performed.

6. A semiconductor memory according to claim 5, wherein the transistors of said series-circuits are of the same conductivity type.

7. A semiconductor memory according to claim 6, wherein said transistors are of P conductivity type.

8. A semiconductor memory according to claim 7, wherein the data read/write signals supplied to the gates of the transistors of the series-circuits of one of said paired transistor circuits are of a first logic level, and the data read/write signals supplied to the gates of the transistors of the series-circuits of the other of said paired transistor circuits are of a second logic level opposite to said first logic level.

9. A semiconductor memory according to claim 6, wherein the data read/write signals supplied to the gates of the transistors of the series-circuits of one of said paired transistor circuits are of a first logic level, and the data read/write signals supplied to the gates of the transistors of the series-circuits of the other of said paired transistor circuits are of a second logic level opposite to said first logic level.

10. A semiconductor memory according to claim 5, wherein the data read/write signals supplied to the gates of the transistors of the series-circuits of one of said paired transistor circuits are of a first logic level, and the data read/write signals supplied to the gates of the transistors of the series-circuits of the other of said paired transistor circuits are of a second logic level opposite to said first logic level.

11. A semiconductor memory according to claim 5, wherein each of said paired transistor circuits further comprises a further transistor connected between said circuit node and a reference node.

12. A semiconductor memory according to claim 11, wherein said further transistor is of a conductivity type opposite to said transistors of said series-circuits.

13. A semiconductor memory according to claim 12, wherein a gate of said further transistor receives a control signal which during the first or second parallel bit test renders the further transistor turned on to connect said circuit node to said reference node.

14. A semiconductor memory according to claim 11, wherein a gate of said further transistor receives a control signal which during the first or second parallel bit test renders the further transistor turned on to connect said circuit node to said reference node.

15. A semiconductor memory according to claim 5, wherein each of said paired transistor circuits further comprises delay means including series-connected inverters connected to said circuit node.

16. A semiconductor memory according to claim 5, wherein said series-circuits of each of said paired transistor circuits are divided into two half groups.

17. A semiconductor memory according to claim 16, wherein each of said paired transistor circuits further comprises a second logic circuit for performing a logic operation of a signal of said circuit node to which the series-circuits of one of said group are connected and a signal of said circuit node to which the series-circuits of the other of said groups are connected.

18. A semiconductor memory according to claim 17, wherein said second logic circuit comprises a NOR gate.

19. A semiconductor memory according to claim 18, wherein said NOR gate is of two input type, one of which for receiving a signal of said circuit node which the series-circuits of one of said group are connected to and the other of which a signal of said circuit node which the series-circuits of the other of said groups are connected to.

20. A semiconductor memory according to claim 17, wherein said first logic gate circuit comprises two logic gates, one of which for receiving outputs of said second logic gates in one of said paired transistor circuits which the data read/write signals of a logic level are supplied to and the other of which for receiving outputs of said second logic gates in ones of said paired transistor circuits which the data read/write signals of an opposite logic level are supplied to.

21. A semiconductor memory according to claim 20, wherein said first test circuit receives outputs of said two logic gates to produce an output signal, which has a first logic level when all of the data read out of selected memory cell blocks of said memory cell arrays have the same logic level and a second logic level opposite to said first logic level when at least one of the read out data has a logic level opposite to that of the others.

22. A semiconductor memory according to claim 20, wherein said first test circuit comprises a signal generating circuit and an output buffer, the signal generating circuit having a first output terminal and a second output terminal, the signal generating circuit for receiving outputs of said two logic gates of said first logic gate circuit to output a signal of said first logic level from said first output terminal and a signal of said second logic level from said second output terminal when said outputs of said two logic gates have different logic levels, and to output a signal of said second logic level from said first output terminal and a signal of said first logic level from said second output terminal when the outputs of said two logic gates have the same logic level, said output buffer for receiving the output signals of said signal generating circuit to output a signal of said first logic level when the first and the second output signals of said first and said second output terminals of said signal generating circuit have the first and the second logic levels, respectively, and to produce a signal of said second logic level when the first and the second output signals of said first and said second output terminals of said signal generating circuit have the second and the first logic levels, respectively.

23. A semiconductor memory according to claim 22, wherein said signal generating circuit comprises a NAND gate for receiving the outputs of said two logic gates of said first logic gate circuit, an AND gate for receiving the outputs of said two logic gates, an inverter for receiving an output of said NAND gate, a NOR gate for receiving an output of said AND gate and a control signal, a first AND gate for receiving the output of one of said two logic gates and a first mode signal, a second AND gate for receiving the output of the other of said two logic gates and said first mode signal, a third AND gate for receiving an output of said inverter and a second mode signal, a fourth AND gate for receiving an output of said NOR gate and said second mode signal, a first NOR gate for receiving outputs of said first and said third AND gates to output a signal, and a second NOR gate for receiving outputs of said second and said fourth AND gates to output a signal.

24. A semiconductor memory according to claim 22, wherein said output buffer comprises a first transistor circuit including a CMOS inverter controlled by a control signal of the second logic level, a MOS transistor of a first channel type controlled by said output signal of said second NOR gate, connected between a power source potential terminal and one terminal of a current path of said CMOS inverter, and a MOS transistor of a second channel type controlled by a control signal of the first logic level, connected between another terminal of the current path of said CMOS inverter and a reference potential, a second transistor circuit including a second CMOS inverter controlled by said control signal of the second logic level, a MOS transistor of a first channel type controlled by said output signal of said first NOR gate, connected between said power source potential terminal and one terminal of a current path of said second CMOS inverter, and a MOS transistor of said second channel type controlled by a control signal of the first logic level, connected between another terminal of the current path of said second CMOS inverter and said reference potential, a first series-connection of a NAND gate and an inverter, the NAND gate for receiving a control signal and an output of said CMOS inverter of said first transistor circuit, the inverter for inverting an output of said NAND gate, a second series-connection of a NAND gate and an inverter, the NAND gate for receiving a control signal and an output of said CMOS inverter of said second transistor circuit, the inverter for inverting an output of said NAND gate, cross-coupled MOS transistors of said second channel type, one terminal of a current path of one of the cross-coupled MOS transistors being connected to an output terminal of said first CMOS inverter and an output terminal of said inverter of said first series-connection, one terminal of a current path of another of the cross-coupled MOS transistors being connected to an output terminal of said second CMOS inverter and an output terminal of said second CMOS inverter and an output terminal of said inverter of said second series-connection, another terminal of the current path of said one of the cross-coupled MOS transistors being connected to another terminal of the current path of said another of the cross-coupled MOS transistors, a gate of said one transistor being connected to said one terminal of the current path of said another transistor, and a gate of said another transistor being connected to said one terminal of the current path of said one transistor, a first NAND gate for receiving the output of said first CMOS inverter and an enabling signal, a second NAND gate for receiving the output of said second MOS inverter and the enabling signal, and an output transistor circuit including a MOS transistor of the first channel type controlled by an output of said first NAND gate and a MOS transistor of the second channel type controlled by an output of said second NAND gate via an inverter, connected in series between the power source potential terminal and the reference potential terminal.

25. A semiconductor memory according to claim 17, wherein said two logic gates comprises two NAND gates, one of which for receiving outputs of said second logic gates in ones of said paired transistor circuits which the data read/write signals of a logic level are supplied to and the other of which for receiving outputs of said second logic gates in ones of said paired transistor circuits which the data read/write signals of an opposite logic level are supplied to.

26. A semiconductor memory according to claim 17, wherein each of said second-test performing test circuit receives outputs of the second logic circuits of the paired transistor circuits of a corresponding multiplexer to output a signal, which has the first logic level when the data read out of a selected memory cell of a corresponding memory array have the same logic level and has the second logic level when at least one of the data has a logic level opposite to that of the others.

27. A semiconductor memory, comprising:

a memory cell block comprising a plurality of memory cells;

two pairs of word lines connected to said memory cells of said memory cell block;

n pairs of bit lines connected to said memory cells of said memory cell block;

n pairs of DQ data lines connected to said n pairs of bit lines and divided into two groups each comprising n/2 pairs of the DQ data lines, a group of n/2 pairs of the DQ lines being arranged at a side of said memory cell block and another group of n/2 pairs of the DQ lines being arranged at an opposite side of said memory cell block; and sense amplifiers and bit line precharge circuits connected to said bit line pairs and column selection gates connected to said bit lines, said sense amplifiers, said bit line precharge circuits and said column selection gates being alternately arranged at a side and an opposite side of said memory cell block every predetermined number of the bit line pairs.

28. A semiconductor memory according to claim 27, wherein said memory cells are dynamic memory cells.

29. A semiconductor memory, comprising:

memory cell blocks;

groups of pairs of DQ data lines arranged between corresponding two memory cell blocks and shared by the corresponding two memory cell blocks;

groups of DQ buffers provided in correspondence to said memory cell blocks;

groups of pairs of DP data lines provided in correspondence to said DQ buffer groups; and switches provided in correspondence to said DQ data line pair groups, each for switchingly connecting a corresponding DQ data line pair group to two DP data line pair groups corresponding to two DQ buffer groups corresponding to two memory cell blocks adjacent to the corresponding DQ data line pair group.

30. A semiconductor memory according to claim 29, further comprising pairs of data read/write lines connected in common to said DQ buffer groups, extending in a direction orthogonal to said direction of said memory cell blocks.

31. A semiconductor memory according to claim 29, wherein each of said switches comprises CMOS transfer gates.

32. A semiconductor memory according to claim 29, wherein said memory cells are dynamic memory cells.

33. A semiconductor memory according to claim 29, wherein each of said DQ buffers comprises a first and a second MOS transistors of the first channel type controlled by a first control signal, connected between a power supply potential and one and another of a corresponding pair of the DP data lines, a third MOS transistor of the first channel type connected between the corresponding DP data line pair, controlled by said first control signal, a fourth and a fifth MOS transistors of the first channel type connected between said power supply potential and said another and said one of the DP data line pair, first and second control circuits for controlling said fourth and said fifth MOS transistors, respectively, the first control circuit comprising a first NOR gate for receiving a second control signal and a signal of one data read/write line of a corresponding data read/write line pair, first and second inverters each receiving an output of the first NOR gate, outputs of said first and second inverters being connected to a gate of said fourth MOS transistor and a node of said one DP data line, to which said fifth MOS transistor is connected, respectively, the second control circuit comprising a second NOR gate for receiving a third control signal complementary to said second control signal and a signal of another data read/write line of the corresponding data read/write line pair, third and fourth inverters each receiving an output of the second NOR gate, outputs of said first and second inverters being connected to a gate of said fifth MOS transistor and a node of said another DP data line, to which said fourth MOS transistor is connected, respectively, a sixth and a seventh MOS transistors of the first channel type controlled by said first control signal, connected between said power supply potential and said one and said another of said corresponding DP data line pair, and an eighth MOS transistor of the first channel type connected between the corresponding DP data line pair, controlled by said first control signal, a ninth and a tenth cross-coupled MOS transistors of the first channel type connected between said power supply potential and said one and said another of said corresponding DP data line pair, respectively, gates of said ninth and said tenth MOS transistors of the first channel type being connected to said another and said one of said corresponding DP data line pair, respectively, an eleventh and a twelfth cross-coupled MOS transistors of the second channel type being connected to a terminal for receiving a fourth control signal and said one and said another of said corresponding DP data line pair, respectively, the gates of the eleventh and the twelfth transistors being connected to said one and said another of said corresponding DP data line pair, respectively, a third NOR gate for receiving a signal of said one of said corresponding DP data line pair and a fifth control signal, a fourth NOR gate for receiving a signal of said another of said corresponding DP data line pair and said fifth control signal, a thirteenth MOS transistor of the second channel type connected between said one data read/write line of said corresponding data read/write line pair and a reference potential, controlled by an output of said third NOR gate, a fourteenth MOS transistor of the second channel type connected between said another data read/write line of said corresponding data rad/write line pair and said reference potential, controlled by said output of said fourth NOR gate, a fifteenth and a sixteenth cross-coupled MOS transistors of the second channel type connected between the outputs of said third and said fourth NOR gates, respectively, and said reference potential, the gates of said fifteenth and said sixteenth MOS transistors being connected to the outputs of said fourth and said third NOR gates, respectively, and a seventeenth and a nineteenth MOS transistors inserted in said one and said another DP data lines, respectively, said first to said fifth MOS transistors being at a side of said seventeenth and said eighteenth MOS transistors and said sixth to sixteenth MOS transistors and said third and said NOR gates being at an opposite side of said seventeenth and said eighteenth MOS transitors.

34. A semiconductor memory, comprising:

n-bit blocks of memory cells;

groups of pairs of DQ data lines, each comprising n/2 pairs of the DQ data lines and arranged between corresponding two memory cell blocks;

groups of DQ buffers provided in correspondence to said memory cell blocks, each comprising n/2 buffers;

groups of pairs of DP data lines provided in correspondence to said DQ buffers, each comprising n/2 pairs of the DP data lines; and switches provided in correspondence to said DQ data line pair groups, each for switchingly connecting a corresponding DQ data line pair group to two DQ data line pair groups corresponding to two DQ buffers corresponding to two memory cell blocks adjacent to the corresponding DQ line.

35. A semiconductor memory according to claim 34, further comprising n pairs of data read/write lines connected in common to said DQ buffer groups, extending in a direction orthogonal to said direction of said memory cell blocks.

36. A semiconductor memory according to claim 34, wherein each of said switches comprises CMOS transfer gates.

37. A semiconductor memory according to claim 34, wherein said memory cells are dynamic memory cells.

38. A semiconductor memory according to claim 34, wherein each of said DQ buffers comprises a first and a second MOS transistors of the first channel type controlled by a first control signal, connected between a power supply potential and one and another of a corresponding pair of the DP data lines, a third MOS transistor of the first channel type connected between the corresponding DP data line pair, controlled by said first control signal, a fourth and a fifth MOS transistors of the first channel type connected between said power supply potential and said another and said one of the DP data line pair, first and second control circuits for controlling said fourth and said fifth MOS transistors, respectively, the first control circuit comprising a first NOR gate for receiving a second control signal and a signal of one data read/write line of a corresponding data read/write line pair, first and second inverters each receiving an output of the first NOR gate, outputs of said first and second inverters being connected to a gate of said fourth MOS transistor and a node of said one DP data line, to which said fifth MOS transistor is connected, respectively, the second control circuit comprising a second NOR gate for receiving a third control signal complementary to said second control signal and a signal of another data read/write line of the corresponding data read/write line pair, third and fourth inverters each receiving an output of the second NOR gate, outputs of said first and second inverters being connected to a gate of said fifth MOS transistor and a node of said another DP data line, to which said fourth MOS transistor is connected, respectively, a sixth and a seventh MOS transistors of the first channel type controlled by said first control signal, connected between said power supply potential and said one and said another of said corresponding DP data line pair, and an eighth MOS transistor of the first channel type connected between the corresponding DP data line pair, controlled by said first control signal, a ninth and a tenth cross-coupled MOS transistors of the first channel type connected between said power supply potential and said one and said another of said corresponding DP data line pair, respectively, gates of said ninth and said tenth MOS transistors of the first channel type being connected to said another and said one of said corresponding DP data line pair, respectively, an eleventh and a twelfth cross-coupled MOS transistors of the second channel type being connected to a terminal for receiving a fourth control signal and said one and said another of said corresponding DP data line pair, respectively, the gates of the eleventh and the twelfth transistors being connected to said one and said another of said corresponding DP data line pair, respectively, a third NOR gate for receiving a signal of said one of said corresponding DP data line pair and a fifth control signal, a fourth NOR gate for receiving a signal of said another of said corresponding DP data line pair and said fifth control signal, a thirteenth MOS transistor of the second channel type connected between said one data ready/write line of said corresponding data read/write line pair and a reference potential, controlled by an output of said third NOR gate, a fourteenth MOS transistor of the second channel type connected between said another data read/write line of said corresponding data read/write line pair and said reference potential, controlled by said output of said fourth NOR gate, a fifteenth and a sixteenth cross-coupled MOS transistors of the second channel type connected between the outputs of said third and said fourth NOR gates, respectively, and said reference potential, the gates of said fifteenth and said sixteenth MOS transistors being connected to the outputs of said fourth and said third NOR gates, respectively, and a seventeenth and a nineteenth MOS transistors inserted in said one and said another DP data lines, respectively, said first to said fifth MOS transistors being at a side of said seventeenth and said eighteenth MOS transistors and said sixth to sixteenth MOS transistors and said third and said NOR gates being at an opposite side of said seventeenth and said eighteenth MOS transistors.

* * * * *